United States Patent [19]

Robinson

[11] Patent Number: 4,877,752

[45] Date of Patent: Oct. 31, 1989

[54] 3-D PACKAGING OF FOCAL PLANE ASSEMBLIES

[75] Inventor: William L. Robinson, El Toro, Calif.

[73] Assignee: The United States of America as represented by the Secretary of the Army, Washington, D.C.

[21] Appl. No.: 265,107

[22] Filed: Oct. 31, 1988

[51] Int. Cl.[4] .......................................... H01L 21/302
[52] U.S. Cl. ........................................ 437/51; 437/48; 437/225; 437/249; 437/915; 437/226; 148/DIG. 164
[58] Field of Search .................... 437/51, 48, 225, 249, 437/915, 226; 148/DIG. 164, DIG. 115

[56] References Cited

U.S. PATENT DOCUMENTS 4,734,380  3/1988  Tsang ..................................... 437/51
4,737,470  3/1988  Bean ...................................... 437/51

Primary Examiner—Brian E. Hearn
Assistant Examiner—Beverly A. Pawlikowski
Attorney, Agent, or Firm—Hay Kyung Chang; Freddie M. Bush

[57] ABSTRACT

In three-dimensional packaging of focal plane signal processing electronics, the necessity of routing conductors from the face of the die to the edge of the die in the module for placement of inter-connection pads for interconnection to the next assembly presents the problem of electrical isolation of the conductors from adjacent silicon dies and their underlying silicon substrate. This problem is avoided by the use of a gold ribbon lead that is bonded to the face of each die. The ribbons function as electrically isolated conductive risers upon which inter-connection pads are placed for connection to the next assembly and as precision spacers between stacked dies during module assembly.

5 Claims, 1 Drawing Sheet

3-D PACKAGING OF FOCAL PLANE ASSEMBLIES

DEDICATORY CLAUSE

The invention described herein was made in the course of or under a contract or subcontract thereunder with the Government and may be manufactured, used, and licensed by or for the Government for governmental purposes without the payment to me of any royalties thereon.

BACKGROUND OF THE INVENTION

In the three-dimensional (3-D) packaging of focal plane signal processing electronics, silicon dies are stacked together vertically and bonded to form a module assembly. This necessitates the routing of conductors from the face of the die to the edge of the die for placement of inter-connects to the next assembly. In such a routing method, there arises a problem of electrical isolation of these conductors from the underlying silicon, especially when the silicon is highly doped and remains conductive at the operating temperature of the module.

SUMMARY OF THE INVENTION

A gold ribbon lead is bonded to the face of each die of a module and is used to provide a means for conductive connection to the next module assembly.

DESCRIPTION OF THE PREFERRED EMBODIMENT

Figure 1:
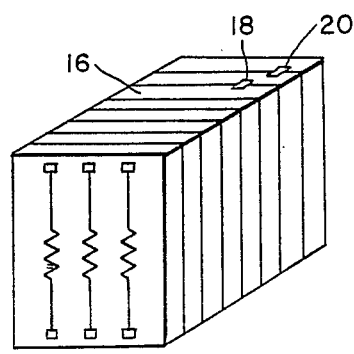
FIG. 1 depicts a stacked electronics module composed of silicon dies with a gold ribbon bonded to the face of each die.
Figure 2:
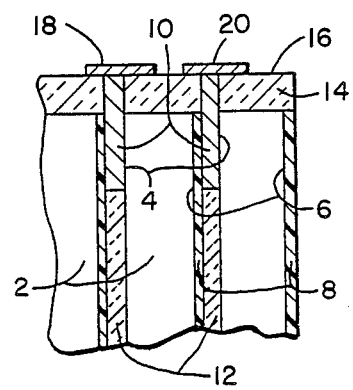
FIG. 2 shows a view of a section of the module detailing how the gold ribbons are incorporated into the module.

Referring now to the drawings wherein like numbers refer to like parts, FIGS. 1 and 2 show a 3-D focal plane signal processing electronics module in which the problem of electrical isolation of conductors from the underlying conductive silicon dies 2 is resolved by the use of gold ribbon leads 10 which are bonded on die faces 4 and lead to edge inter-connection pads 18 and 20, respectively.

Incorporation of gold ribbons into the 3-D focal plane assembly is a simple procedure, as can be seen in FIG. 2. Initially, a silicon wafer is processed in the standard manner for making electronic dies. Then the back surface of the wafer is lapped to a desired thickness less 0.0005 inches. Afterwards, on the back surface of the wafer 6, dielectric material 8 is deposited to provide electrical isolation of individual dies within the module stack when the dies are assembled into a module configuration. The thickness of the dielectric material is adjusted to give the total wafer a thickness which is within $1\frac{1}{4}$ $\mu$m or less of the desired value. Dielectric material 8 may be polyimide epoxy, deposited nitride or oxide. Then the processed wafer is cut into individual dies 2. A gold ribbon 10 approximately 0.003 inches wide by 0.0005 inches thick is bonded to face 4 of each die so that the ribbon extends over the edge of the die to provide a gold ribbon lead of approximately 0.010 inches long. The ribbon leads perform two main functions. First, after die stack-up, encapsulation and polishing, the ribbons function as conductive risers upon which inter-connection pads 18, 20, may be deposited to provide means for connection to the next assembly. Second, the ribbons function as precision spacers between silicon dies during module stackup. The bonding of gold ribbon may be accomplished by thermocompression wedge bond, micro-gap welding or any other suitable micro-joining process. The dies are then stacked together vertically in an alignment fixture to form a module and compressed until the required module thickness is obtained. The space between dies created by the presence of the gold ribbon is filled with epoxy 12 and cured. The method may be wicking or use of vacuum. On the surface of the module that contains the gold ribbon leads, dielectric insulation 14 is deposited. Polyimide epoxy or equivalent deposited to a thickness of $\frac{1}{2}$mm minimum is suitable as the dielectric insulation. The extensions of the gold ribbon leads are removed flush with surface 16 and the surface is polished flat. The surface is then resisted to expose the gold ribbons upon which are deposited inter-connection bond pads, 18, 20 by resist lift-off method or through a shadow mask. Depending on the inter-connection scheme used, bond pads may be of indium, or other metallic substance such as titanium-gold. The gold ribbon center to center spacing and the resultant bond pads may be adjusted by varying the thickness of the lapped silicon wafer and the gold ribbon.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

I claim:

1. A method for three-dimensional packaging of a focal plane module assembly, comprising the steps of:
    processing a silicon wafer in the customary manner to make electronic dies having dielectric material on a surface;
    cutting said wafer into multiple individual dies, said dies each having a front side and a back side and further having said dielectric material on said back side;
    bonding a gold ribbon to said front side of each die, using a suitable micro-joining process, said ribbon having a first end and a second end, so that said first end is attached to said front side of said die away from edges of said die and said second end extends over an edge of said die to form a gold ribbon extension of a suitable length;
    stacking and aligning said dies in an alignment mode and compressing said dies together to a preset total thickness to produce a module, said module having a top surface and a bottom surface, said top and bottom surfaces containing said gold ribbon extensions;
    back filling spaces between individual dies with epoxy and curing;
    depositing and curing dielectric insulation material to a suitable thickness on said top surface of said module;
    removing any excess of said gold ribbon extensions and polishing said dielectric insulation material on said top surface;
    resisting said top surface and exposing tips of said gold ribbons;

depositing conductive bond pads so that said bond pads are in contact with said tips of said gold ribbons.

2. A method as cited in claim 1, further including said gold ribbons each being approximately 0.003 inches wide and 0.0005 inches thick.

3. A method as cited in claim 2, further including extending said gold ribbons over said edge of said die by approximately 0.010 inches.

4. A method as cited in claim 3, including lapping said back surface of said wafer to a desired thickness less approximately 0.0005 inches.

5. In a method of three-dimensional packaging of focal plane assemblies wherein silicon dies are stacked together vertically with insulation therebetween and bonded to form a module, said dies having a front and back surface and said module having a top surface and a bottom surface, the improvement comprising:

bonding a gold ribbon having a first end and a second end on each die front surface at said first end and said second end extending above said top and bottom surface of said module, said gold ribbon functioning as an electrically insulated conductive riser on which an inter-connection pad may be deposited and as a precision spacer between said silicon dies within said module.

* * * * *